(12) United States Patent
Speck et al.

(10) Patent No.: US 7,330,031 B2
(45) Date of Patent: Feb. 12, 2008

(54) MATRIX SHIM SYSTEM WITH GROUPED COILS

(75) Inventors: Thomas Speck, Thalwil (CH); Werner Tschopp, Forch (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/506,799

(22) Filed: Aug. 21, 2006

(65) Prior Publication Data

US 2007/0052420 A1 Mar. 8, 2007

(30) Foreign Application Priority Data

Sep. 3, 2005 (EP) .................................. 05019176

(51) Int. Cl.
*G01V 3/00* (2006.01)
(52) U.S. Cl. ..................................... 324/320
(58) Field of Classification Search ........ 324/300–322; 335/296–306
See application file for complete search history.

(56) References Cited

U.S. PATENT DOCUMENTS

| 3,287,630 | A | | 11/1966 | Gang |
| 3,622,869 | A | * | 11/1971 | Golay ........................ 324/320 |
| 4,949,043 | A | * | 8/1990 | Hillenbrand et al. ........ 324/320 |
| 5,490,509 | A | * | 2/1996 | Carlson et al. ............. 600/410 |
| 5,661,401 | A | | 8/1997 | Ishikawa |
| 5,760,582 | A | * | 6/1998 | Morrone ..................... 324/318 |
| 6,084,497 | A | * | 7/2000 | Crozier et al. .............. 335/299 |
| 2005/0110492 | A1 | | 5/2005 | Watkins |

OTHER PUBLICATIONS

S.E. Ungersma et al. "Shim Design Using a Linear Programming Algorithm". Magnetic Resonance in Medicine Wiley USA, vol. 52, No. 3, Sep. 2004, pp. 619-627.

P. Konzbul et al. "Design of Matrix Shim Coils System for Nuclear Magnetic Resonance". IEEE Transactions on Magnetics IEEE USA, vol. 36, No. 4, Jul. 2000, pp. 1732-1735.

* cited by examiner

*Primary Examiner*—Brij Shrivastav
*Assistant Examiner*—Dixomara Vargas
(74) *Attorney, Agent, or Firm*—Paul Vincent

(57) ABSTRACT

A matrix shim system for generating magnetic field components superimposed on a main static magnetic field, comprising a plurality of annular coils, is characterized in that it comprises g groups $G_1 \ldots G_g$ of coils, with g being a natural number $\geq 1$, wherein each group $G_i$ consists of at least two single annular coils connected in series, wherein each group $G_i$ is designed to generate, in use, a magnetic field $$B_z(G_i) = \sum_{n=0}^{\infty} A_{n0}(G_i) \cdot T_{n0}.$$

For each group $G_i$, there are at least two values of n for which $$\frac{|A_{n0}(G_i) \cdot R^n|}{\max\{|A_{20}(G_i) \cdot R^2|, \ldots, |A_{N0}(G_i) \cdot R^N|\}} \geq 0.5 \text{ and } N \geq n \geq 2,$$

with N: the total number of current supplies of the matrix shim system, and R: smallest inside radius of any of the annular coils of the matrix shim system. An individual, adjustable electrical current supply is provided for each group $G_i$ of coils. The inventive matrix shim system is both simple in design and stable against current fluctuations.

22 Claims, 8 Drawing Sheets

MATRIX SHIM SYSTEM WITH GROUPED COILS

This application claims Paris Convention priority of EP 05 019 176.6 filed Sep. 3, 2005 the complete disclosure of which is hereby incorporated by reference.

BACKGROUND OF THE INVENTION

The invention relates to a matrix shim system for generating magnetic field components superimposed on a main static magnetic field parallel to a z-axis, wherein said magnetic field components act to homogenize the magnetic field component of the main static magnetic field along the z-axis in a volume of interest, wherein the volume of interest is centered at the origin of the z-axis, and wherein the matrix shim system comprises a plurality of annular coils, the axes of the annular coils coinciding-with the z-axis.

Such a matrix shim system is described in P. Konzbul et al., "Design of Matrix Shim Coils System for Nuclear Magnetic Resonance", IEEE Transactions on Magnetics 36 (2000), No. 4, p. 1732-1736.

Nuclear magnetic resonance (=NMR) is a powerful tool in chemical analysis and imaging of samples. A sample is positioned in a strong static magnetic field and is subjected to electromagnetic pulses. The reaction of the nuclei of the sample is measured and analyzed.

The characteristics of the static magnetic field influence the quality of information that can be obtained from the sample. In general, best quality is achieved with high field strength and a high homogeneity (uniformity) of the static magnetic field.

The static magnetic field is generated by a main magnetic coil system, which is, in general, superconducting. The main magnetic coil system generates a main static magnetic field with a high field strength, but typically with an insufficiently low homogeneity. In order to homogenize the main static magnetic field, a shim system is used. The shim system generates magnetic field components which, when superimposed to the main static magnetic field, result in an overall static magnetic field with high homogeneity.

The main static magnetic field $B_z$ in a z-direction can be described with a series expansion, with its summands being spherical harmonic functions $T_{nm}$ multiplied with coefficients $A_{nm}$, with n, m indices of summation. In typical cylindrically symmetric NMR geometries, m=0. The summand $A_{00}T_{00}$ describes the desired strong magnetic field, the summand $A_{10}T_{10}$ describes a field gradient that may be desired or not, according to the intended application and that may be dealt with a set of gradient coils, and all summands $A_{n0}T_{n0}$, with $n \geq 2$, describe undesired inhomogeneities.

Conventional shim systems consist of several coils arrangements, with each coil arrangement consisting of a coil or a group of coils. Each coil arrangement generates magnetic field components corresponding to one of the spherical harmonic functions. In other words, each coil arrangement may compensate for exactly one summand $A_{n0}T_{n0}$, with $n \geq 2$, assuming that an appropriate current is chosen within the coil arrangement, according to its so-called gradient strength. Each coil arrangement has its own current supply. The more coil arrangements used, the more orders of inhomogeneity which may be compensated.

However, these traditional shim systems are disadvantageous in that different coil arrangements (for different orders) would ideally occupy the same space within an NMR system. This may limit the achievable gradient strength of a coil arrangement, and it may limit, in the end, the number of orders of inhomogeneity that can be compensated for. Moreover, power efficiency in traditional shim systems is low since there are often windings of coils in close proximity to currents running in opposite direction, mostly canceling out each others' fields.

To overcome these disadvantages so called conventional matrix shim systems [5] are used. A matrix shim system has a plurality of coils, with each coil being fed by its own current source. Each coil contributes to several spherical harmonics. By carefully choosing the current (and thus the strength of the magnetic field generated) in each coil of the matrix shim system, it is possible to homogenize a main static magnetic field up to an order corresponding to the number of coils. When the number of coils exceeds the order of the main static magnetic field to be homogenized, additional conditions may be respected. Neighboring windings with oppositely running currents, as within a traditional shim systems, may be replaced with one single coil, for example. As a result, a matrix shim system is much simpler than a traditional shim system.

However, matrix shim systems also have disadvantages. Each coil has its strongest contribution to the resulting static magnetic field by an $A_{00}$ summand. The $A_{00}$ magnetic field component directly influences the measured spectra. This means that fluctuations in the power supply of any one coil cause side bands or increase the noise floor in measured NMR spectra.

Moreover, current sources, which are typically digitally controlled, may change their current value only in finite steps. Calculated current values for the coils must be rounded to feasible values. This causes significant deviations from the desired static magnetic field, in particular in the $A_{00}$ and the $A_{10}$ components.

It is accordingly the object of the invention to provide a shim system having the advantages of a matrix shim system, in particular simple coil geometries, the possibility to freely combine elementary fields, optimization of additional parameters, and at the same time providing very stable magnetic field components so a high quality of NMR measurements may be obtained.

SUMMARY OF THE INVENTION

This object is achieved, in accordance with the invention, by a matrix shim system of the above kind, characterized in that the matrix shim system comprises g groups $G_1 \ldots G_g$ of coils, with g being a natural number $\geq 1$, wherein each group $G_i$ consists of at least two single annular coils $C_{i1} \ldots C_{ic(i)}$ connected in series, with i: index number of the group, and c(i) being the amount of annular coils within group i, each group $G_i$ being designed to generate, in use, a magnetic field $$B_z(G_i) = \sum_{n=0}^{\infty} A_{n0}(G_i) \cdot T_{n0} = \sum_{n=0}^{\infty} [A_{n0}(G_i) \cdot R^n] \cdot [T_{n0}/R^n],$$

with $A_{n0}$: series coefficients of order n and degree 0, $T_{n0}$: spherical harmonic function of order n and degree 0; and n: index of summation, and wherein the highest value $B_{max}$ of the harmonic field components of an order between 2 and N of group $G_i$ is given by $$B_{max}(G_i) = \max \{|A_{20}(G_i) \cdot R^2|, \ldots, |A_{N0}(G_i) \cdot R^N|\},$$

and, for each group $G_i$, there are at least two values of n for which $$\frac{|A_{n0}(G_i) \cdot R^n|}{B_{\max}(G_i)} \geq 0.5 \text{ and } N \geq n \geq 2,$$

with N: the total number of current supplies connected to annular coils of the matrix shim system, and R: smallest inside radius of any of the annular coils of the matrix shim system. Moreover, each group $G_i$ of coils has an individual, adjustable electrical current supply (12).

Conventional matrix shim systems, consist of isolated coils, each having an individual power supply. Each coil therefore necessarily contributes significantly to the zero and first order magnetic field components ($A_{00}$ and $A_{10}$). In contrast thereto and according to the invention, groups of coils are built within the matrix shim system, with the coils of a group being connected in series and having the same current supply. Such a group contributes significantly to at least two (but typically many more) higher order magnetic field terms ($A_{20}$ or higher). On the other hand, the group may be (and preferably is) designed such that the zero and/or first order field components of its coils cancel each other, at least partly. Thus the group's contribution to the resulting static magnetic field in these components is reduced. In case of current fluctuations of the current supply of a group, the NMR spectrum is less deteriorated then, as compared to known matrix shim systems.

Compared to a traditional shim system and its coil arrangements, a group of the inventive matrix shim system not only contributes to one order of the magnetic field, but to several. This allows much more freedom in the construction of a group, as compared to a coil arrangement of a traditional shim system. With the invention, there is no need to place coils of two groups in identical spaces, or to place coils with opposite windings close to each other. The latter makes the inventive matrix shim system very power-efficient.

In case of annular coils of the inventive matrix shim system not belonging to a group, each of these remaining single coils has an individual current supply. Note that the total number of current supplies indicates the maximum number of orders of the magnetic field that can be homogenized with the inventive matrix shim system.

The radius R basically corresponds to the value of the diameter of the volume of interest. With the factor $R^n$ in the expression $A_{n0}(G_i) \cdot R^n$, the expression has a uniform dimension of a magnetic field strength, independent of the value of the index n. Thus the expressions of different values of n are made comparable.

In a highly preferred embodiment of the inventive matrix shim system, in each group $G_i$, for the two values of n $$\frac{|A_{n0}(G_i) \cdot R^n|}{|A_{00}(G_i)|} \geq 100 \text{ and } \frac{|A_{n0}(G_i) \cdot R^{(n-1)}|}{|A_{10}(G_i)|} \geq 10.$$

For typical inventive matrix shim systems, $$\frac{|A_{n0}(G_i) \cdot R^n|}{|A_{00}(G_i)|}$$

will be between 100 to 1000, and $$\frac{|A_{n0}(G_i) \cdot R^{(n-1)}|}{|A_{10}(G_i)|}$$

will be between 10 to 100. When the groups comply with these conditions, then the contributions to the lower order field components ($A_{00}$ and $A_{10}$) are negligible compared with the higher order field components corresponding to the two values of n. The NMR measurement cannot be disturbed significantly by a current fluctuation.

A preferred embodiment is characterized in that $g \geq 4$, in particular wherein $g \geq 10$. The more coils which belong to groups, the more stable the matrix shim system can be. A larger amount of groups allows a higher number of orders of field components to be homogenized, and/or more degrees of freedom for additional side conditions.

Further preferred is an embodiment characterized in that each annular coil $C_{is}$ belonging to a group $G_i$ is designed to generate, in use, a magnetic field $$B_z(C_{is}) = \sum_{n=0}^{\infty} A_{n0}(C_{is}) \cdot T_{n0},$$

and that for all groups $G_i$, $$\frac{\left|\sum_{s=1}^{c(i)} A_{00}(C_{is})\right|}{\max\{|A_{00}(C_{i1})|, \ldots, |A_{00}(C_{ic(i)})|\}} \leq 0.5,$$

with s: coil index within a group of coils. In other words, within a group of coils, the largest contribution to $A_{00}$ of one of the coils is compensated by the other coils of this group by at least 50%. This reduces the susceptibility of the matrix shim system to current fluctuations.

Equally preferred is an embodiment, characterized in that each annular coil $C_{is}$ belonging to a group $G_i$ is designed to generate, in use, a magnetic field $$B_z(C_{is}) = \sum_{n=0}^{\infty} A_{n0}(C_{is}) \cdot T_{n0},$$

and that for all groups $G_i$, $$\frac{\left|\sum_{s=1}^{c(i)} A_{10}(C_{is})\right|}{\max\{|A_{10}(C_{i1})|, \ldots, |A_{10}(C_{ic(i)})|\}} \leq 0.5,$$

with s: coil index within a group of coils. In other words, within a group of coils, the largest contribution to $A_{10}$ of one of the coils is compensated by the other coils of this group by at least 50%. This also reduces the susceptibility of the matrix shim system to current fluctuations.

In another preferred embodiment, there is at least one group $G_j$ with a first partial coil $C_{j1}$ of $G_j$ that is located such that the distance from the center of this first coil to the center of the volume of interest is less than half the radius a of the coil $C_{j1}$, and the remaining coils of $G_j$ are positioned such that their magnetic fields together with the magnetic fields of the first coil $C_{j1}$ generate no field gradients of order q and lower at the center of the volume of interest, with q: a natural number. With a number of such groups, with sequentially increasing values of q, the adjustment of the currents in the matrix shim system to obtain good uniformity of the resulting magnetic field is particularly simple.

Another preferred embodiment of the inventive matrix shim system is characterized in that there is at least one group $G_k$ of the groups $G_1 \ldots G_g$ consisting of two annular coils $C_{k1}, C_{k2}$ both having a radius of $a_k$, with both coils $C_{k1}, C_{k1}$, being located on the same side of the origin of the z-axis with respect to the z direction, wherein the coil $C_{k1}$ is located at a z-position $t_{k1}$, and the coil $C_{k2}$ is located at a z-position $t_{k2}=a_k^2/t_{k1}$.

In a preferred further development of this embodiment, the coil $C_{k1}$ has a winding number of $N_{k1}$, and the coil $C_{k2}$ has a winding number $N_{k2}=-N_{k1}*a^3/t_{k1}^3$, wherein the minus sign indicates that coil $C_{k1}$ is wound in the opposite direction as coil $C_{k2}$. The group $G_{k1}$, consisting of only two coils, is very simple and the two lowest order spherical harmonics ($A_{00}$ and $A_{10}$) of the two coils cancel almost exactly.

Alternatively or in addition, another further development of said embodiment is characterized in that the z-positions and ratio of winding numbers of the coils of the group $G_k$ are adjusted such that changing the current in these coils has strong indirect influence on the magnetic field in the volume of interest, in particular by causing eddy currents, by changing the magnetization of ferromagnetic or superconducting materials or by coupling to a closed superconducting loop. Thus, the matrix shim system may be shielded.

In a further preferred embodiment of the inventive matrix shim system, at least one group $G_m$ of the groups $G_1 \ldots G_g$ consists of two annular coils $C_{m1}, C_{m2}$ both having a radius of $a_m$ and a winding number of $N_m$, the coil $C_{m1}$ being wound in the other direction as coil $C_{m2}$, wherein the coil $C_{m1}$ is located at a z-position $t_{m1}$, and the coil $C_{m2}$ is located at a z-position $t_{m2}$, with $$\frac{|t_{m1}-t_{m2}|}{a_m} \leq 0.5.$$

The group $G_m$, consisting of only two coils, is very simple and the two lowest order spherical harmonics ($A_{00}$ and $A_{10}$) of the coils cancel almost exactly.

In a further preferred embodiment, there is at least one group $G_p$ consisting of three annular coils $C_{p1}, C_{p2}, C_{p3}$ all having a radius of $a_p$, further having winding numbers $N_{p1}, N_{p2}, N_{p3}$ and being located at z-positions $t_{p1}, t_{p2}, t_{p3}$, with $t_{p1}<t_{p2}<t_{p3}$, the coils $C_{p1}$ and $C_{p3}$ being wound in the other direction as coil $C_{p2}$, wherein $N_{p1}+N_{p3}=N_{p2}$, and $$\frac{|t_{p1}-t_{p2}|}{a_p} \leq 0.5$$

and $$\frac{|t_{p3}-t_{p2}|}{a_p} \leq 0.5.$$

For this group $G_p$, the two lowest order spherical harmonics ($A_{00}$ and $A_{10}$) of the coils cancel almost exactly.

In another preferred embodiment, in each group $G_i$, for the two values of n $$\frac{|A_{n0}(G_i) \cdot R^{(n-2)}|}{A_{20}(G_i)} \geq 10.$$

In this case, the susceptibility of the inventive matrix shim system to current fluctuations is even lower, since the second order field gradient of the resultant static magnetic field may not fluctuate significantly.

In a further advantageous embodiment, the matrix shim system comprises to additional coils that produce magnetic fields that are not axially symmetric with respect to the z-axis.

In a preferred embodiment, the matrix shim system comprises a means for performing an algorithm, which determines the necessary currents to be supplied to the coils of the matrix shim system in order to homogenize the magnetic field component along the z-axis in the volume of interest. In this case, no external means for said algorithm is necessary.

In a further development of this embodiment, the algorithm determines the currents such that indirect influences on the magnetic field in the volume of interest are minimized by using groups of coils to compensate for indirect influences of other coils.

Alternatively or in addition, the algorithm determines the currents such that the amount of heat produced by the coils is minimized. This keeps costs for cooling small.

In another embodiment of the inventive matrix shim system, apart from annular coils intended for generating a $1^{st}$ order field gradient (if such coils are provided), all annular coils of the matrix shim system belong to one of the groups $G_1 \ldots G_g$. In this case, the matrix shim system is particularly stable against current fluctuations.

Further within the scope of the invention is a method for designing an inventive matrix shim system as described above, comprising the steps of
defining parameters describing the coil geometries;
defining ranges of feasible values for said parameters;
defining a cost function F to be minimized, this cost function being calculated for any combination of values for said parameters and is constructed such that lower values resulting from the function evaluation reflect an improvement in the coil design, the cost function F containing terms of the form $$F = w_0 \cdot \sum_{i=1}^{g} |A_{00}(G_i)|^{p0} + w_1 \cdot \sum_{i=1}^{g} |A_{10}(G_i)|^{p1} -$$

$$w_2 \cdot \sum_{i=1}^{g} |A_{20}(G_i)|^{p2} \ldots - w_N \cdot \sum_{i=1}^{g} |A_{N0}(G_i)|^{pN} + F_{not\_G}$$

wherein $w_0, w_1, \ldots, w_N$ defines the relative importance of suppression or production of the spherical harmonic, $p_0, p_1, \ldots, p_N$ define the relative importance of small versus big terms, $F_{not\_G}$ is the cost function for all coils that are not built as groups of coils $G_i$; and
applying a numerical optimization algorithm in order to find a set of parameters that define a minimum of F.

The method provides a robust and simple way to design an inventive matrix shim system.

In a preferred variant of the inventive method, the parameters describing the coil are selected such that coil conditions are automatically fulfilled which reduce the total number of parameters. In this way, the complexity of the numerical problem to be solved can be reduced, and therefore the amount of time and computer power that has to be spent in order to find a usable result can also be reduced.

Another variant of the inventive method is characterized in that the numerical optimization algorithm involves any of the following methods: gradient descent method, conjugated gradient method, simulated annealing, evolutionary optimization and genetic optimization. These listed methods have turned out to be useful in practice.

Further within the scope of the invention is a computer program implementing the steps of the inventive method or one of its variants.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DESCRIPTION OF THE PREFERRED EMBODIMENT

Figure 1:
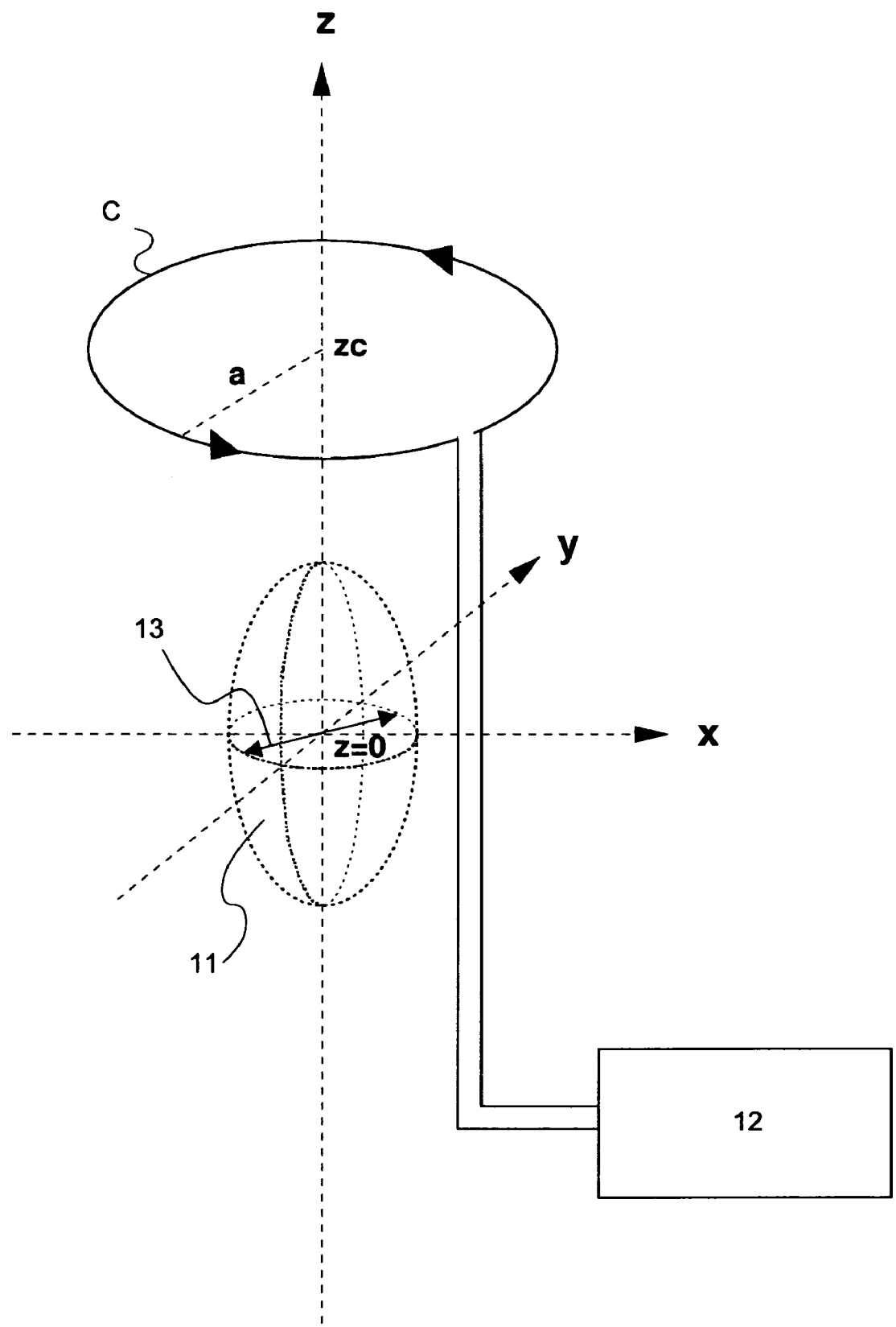
FIG. 1 schematically shows a single annular coil C described by its radius a and its z-position zc with respect to the center of the volume of interest.

The invention relates to an electrical current shim system. Supplying electrical current to a set of spirally wound coils generates corrective magnetic field components of cylindrical symmetry. At least some of the power supplies are connected to a group of at least two annular coils, connected in series. The positions and number of windings of such a group of annular coils is selected such that the resulting magnetic field fulfills certain conditions with high accuracy and temporal stability without relying on the accuracy and temporal stability of the power supply, but fulfills the condition purely by its geometrical configuration. Such conditions are e.g. to produce no field component parallel to the main magnetic field in the volume of interest or to produce no first order field gradient in the volume of interest. Several of these elementary groups of coils are supplied with currents in order to produce shim functions, i.e. magnetic fields of a desired spatial distribution.

The positions and number of windings of an elementary group of annular coils is additionally selected such that the field produced by this group of coils is able to contribute to more than one shim function. The type of shim function is determined by the ratios among the currents supplied to each group of coils. The whole set of current ratios for all shim functions is called the current matrix. This current matrix can be determined in such a way that the power consumption is minimized.

The advantages of a classical series shim system, i.e. accuracy and stability are combined with the advantages of a matrix shim system, i.e. minimization of power consumption.

The present invention relates to an apparatus generating corrective magnetic fields in a volume of interest where high magnetic field uniformity and high magnetic field stability is required such as for instruments for nuclear magnetic resonance.

In nuclear magnetic resonance (NMR) strong magnetic fields of high uniformity are required. E.g. isotope effects on the NMR chemical shift of the order of 0.17 parts per billion have been reported [2]. In order to observe such effects, one needs a magnetic field in the sample to be analyzed with a uniformity of $10^{-10}$. Basic uniformities of magnets do not fulfill this condition. Accordingly, it is common practice to provide an apparatus to compensate for magnetic field non-uniformities. A set of coils to which a control device supplies electrical current produces the desired corrective magnetic field. Such devices are routinely used to achieve high field uniformity. They are known as electrical current shims [1] or shim coils.

For high-resolution NMR, strong magnetic fields up to 21 Tesla are used. Such high magnetic fields are provided by cylindrical superconducting solenoids. The typical configuration used in today's spectrometers consists of a superconducting solenoid providing a strong static magnetic field inside a cylindrical bore, electrical current shim coils distributed on a cylinder inside this bore and a plurality of gradient and high-frequency coils all surrounding a sample. The static magnetic field has a major component parallel to the axis of the bore. A detailed description of such a configuration is given in the patent application of Gang [3].

By using electrical current shims, magnetic fields are produced, which by their nature, are described by the Maxwell equations. In a region where no currents flow and the magnetic permeability is approximately constant, each component of the magnetic field is a harmonic function, i.e. a function u that fulfills equation (1).

$$\Delta u = 0 \quad (1)$$

Here $\Delta$ denotes the Laplace operator which is defined by $$\Delta u = \frac{\partial^2}{\partial x^2}u + \frac{\partial^2}{\partial y^2}u + \frac{\partial^2}{\partial z^2}u$$

Select a coordinate system with z-axis parallel to the main magnetic field $\vec{B}_0 = (0, 0, B_z^0)$. If only small corrections to this field are produced by electrical shim coils, it can be shown that the components $B_x$ and $B_y$ of the correcting coils have no relevant influence on the absolute value $|\vec{B}_0|$ that is required to be uniform. In the further discussion, only the $B_z$ component produced by the correcting coils is discussed. As mentioned above, $B_z$ is a harmonic function and can be described as a sum of spherical harmonic functions. Let r, $\theta$ and $\phi$ be the three components of a polar coordinate system. Then $B_z(r,\theta,\phi)$ near the origin is given by $$B_z(r, \vartheta, \varphi) = \sum_{n=0}^{\infty} \sum_{m=-n}^{n} A_{nm} T_{nm}(r, \vartheta, \varphi) \quad (2)$$

with the spherical harmonic functions $T_{nm}$ $T_{n0}(r,\theta,\phi) = r^n P_n(\cos \theta)$, for $m=0$ $T_{nm}(r,\theta,\phi) = r^n P_{nm}(\cos \theta)\cos m\phi$, for $m>0$ $T_{nm}(r,\theta,\phi) = r^n P_{n|m|}(\cos \theta)\sin |m|\phi$, for $m<0$ where n, m are integers, $P_n$ is the Legendre polynomial of order n, $P_{nm}$ is the associated Legendre polynomial of order n and degree m and $A_{nm}$ are coefficients. In this formulation, creating a uniform magnetic field in the volume of interest is equivalent to achieve the condition $A_{nm}=0$ and for all n, m with the only exception $A_{00}=B_z^0$.

Traditionally electrical current shim coils have been constructed in a way such that each coil produced a magnetic field having a spatial distribution corresponding to one term of the sum in equation (2). The coil geometry defines which spherical harmonic is created and the current flowing through the coil determines how strong the contribution to this spherical harmonic is. This way the contribution of each correcting coil is given by $$A_{nm}^{corr} = G_{nm} I_{nm}$$

where $G_{nm}$ is the so-called gradient strength of the coil and $I_{nm}$ is the current supplied to the coil. Creating a uniform field is now achieved by adjusting the currents $I_{nm}$ such that the correcting magnetic fields cancel the residual field components $A_{nm}^{res}$:

$$A_{nm}^{res} + G_{nm} I_{nm} = 0$$

Spherical harmonics with cylindrical symmetry are of degree m=0 and are termed 'zonal'. The corresponding shim coils are termed 'zonal shims' and are constructed as annular coils. The other spherical harmonics (m≠0) are known as 'tesseral harmonics' and the shim coils producing these are 'tesseral shims' which are produced e.g. by saddle-type coils.

Figure 5:
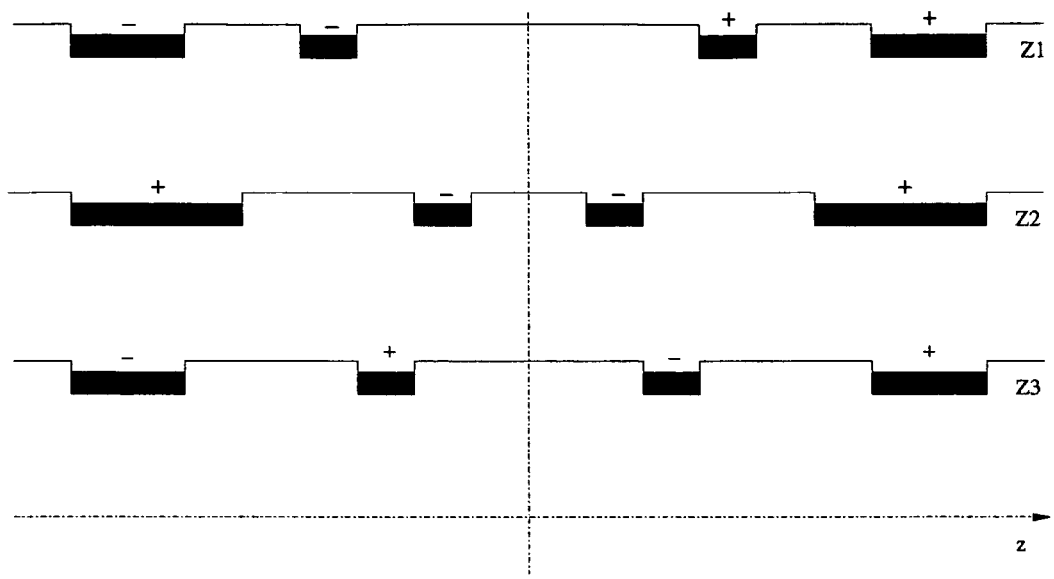
FIG. 5 schematically shows a configuration of coils of a traditional shim system of prior art; each channel, i.e. each combination of coils connected in series and fed by one current source, is shown on a separate row.

A schematic depiction of a coil configuration used to produce fields of cylindrical symmetry is shown in FIG. 5. The signs indicate the winding directions.

Equation (2) contains infinitely many terms whereas any technical realization only can provide a finite set of correction coils. Low orders n of spherical harmonics are relatively easy to create. The higher the order n gets, the more difficulties arise to provide a field with significant strength in the form of the desired spherical harmonic. The more terms in equation (2) which can be corrected, the higher is the uniformity of the magnetic field. Therefore a great deal of effort has been made in order to push the highest correctable order to ever-higher values.

One problem in constructing devices, which contain coils for correcting ever-higher orders of spherical harmonics, arises from the fact that some windings of individual shim coils occupy positions that ideally would also be occupied by another shim coil. Dividing the available space between all the coils that need windings in the same region often limits the total number of windings of a single coil and therefore limits the achievable gradient strength.

Figure 3:
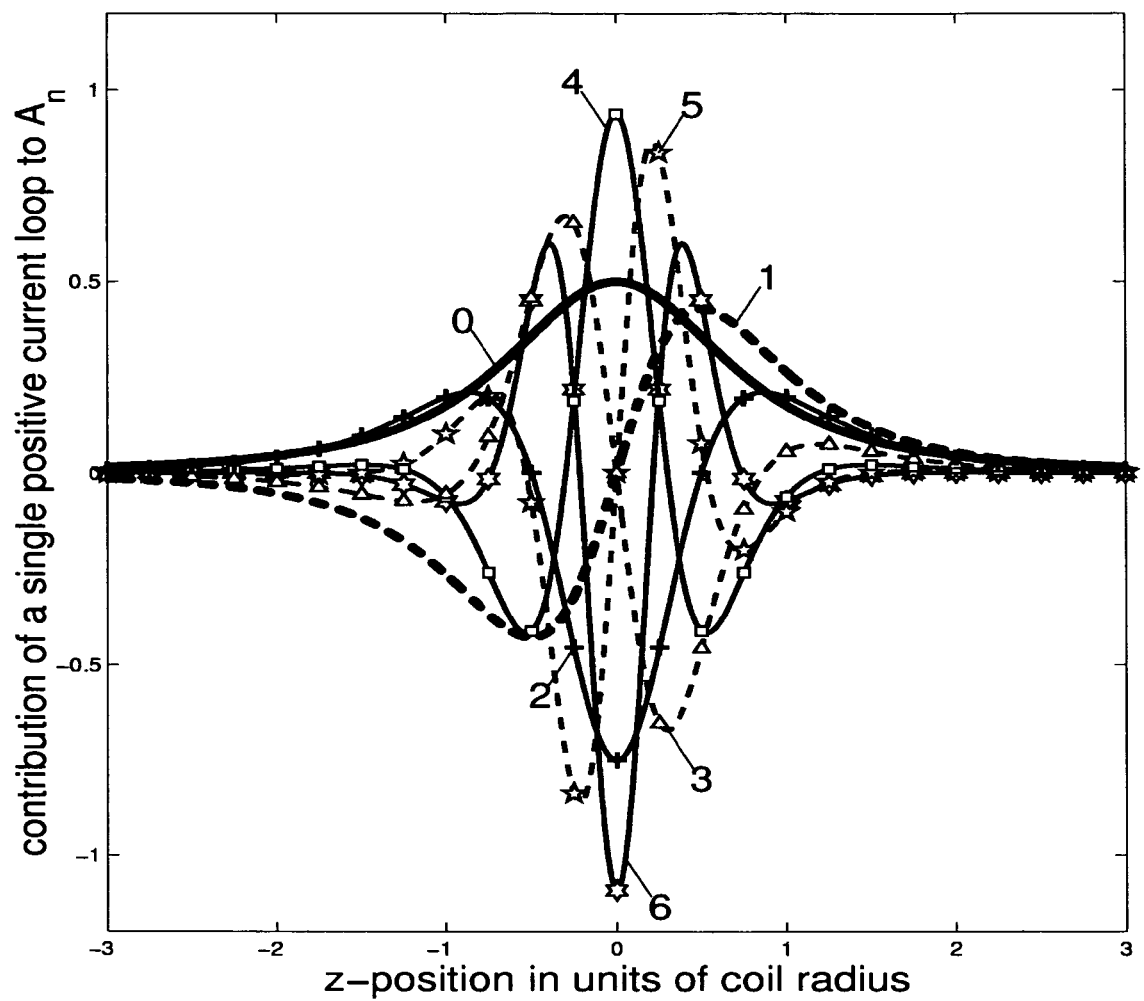
FIG. 3 shows a diagram of the normalized contribution of a single annular coil to spherical harmonics $A_{n0}$ as a function of the z position; the numbers 1 to 6 denote n of the curve belonging to $A_{n0}$.

FIG. 3 shows the normalized (i.e. after removing the dependency from the coil radius a) contribution of a single annular coil at position z to the coefficient $A_{n0}$. This figure shows that most of the contributions to high order coefficients $A_{n0}$ come from a region $$-\frac{1}{2}a < z < \frac{1}{2}a.$$

Available space in this region must be distributed carefully.

The solution to this problem is the use of a matrix shim system [5]. The basic idea is to use simple coils, each of them fed by its own current source. Every coil contributes to several spherical harmonics. By selecting certain ratios among the currents in the different coils, different types of correcting fields can be produced. Matrix shim systems are particularly power-efficient in cases where a conventional system would use currents flowing in opposite directions in closely neighboring windings of different coils. Both currents dissipate power but the fields close to these windings nearly cancel each other.

By using a simple coil that covers the region of the mentioned windings, only a small current is necessary to produce the desired small field change near the coil. Therefore power consumption is reduced compared to the conventional coil arrangement creating the same field.

Figure 6:
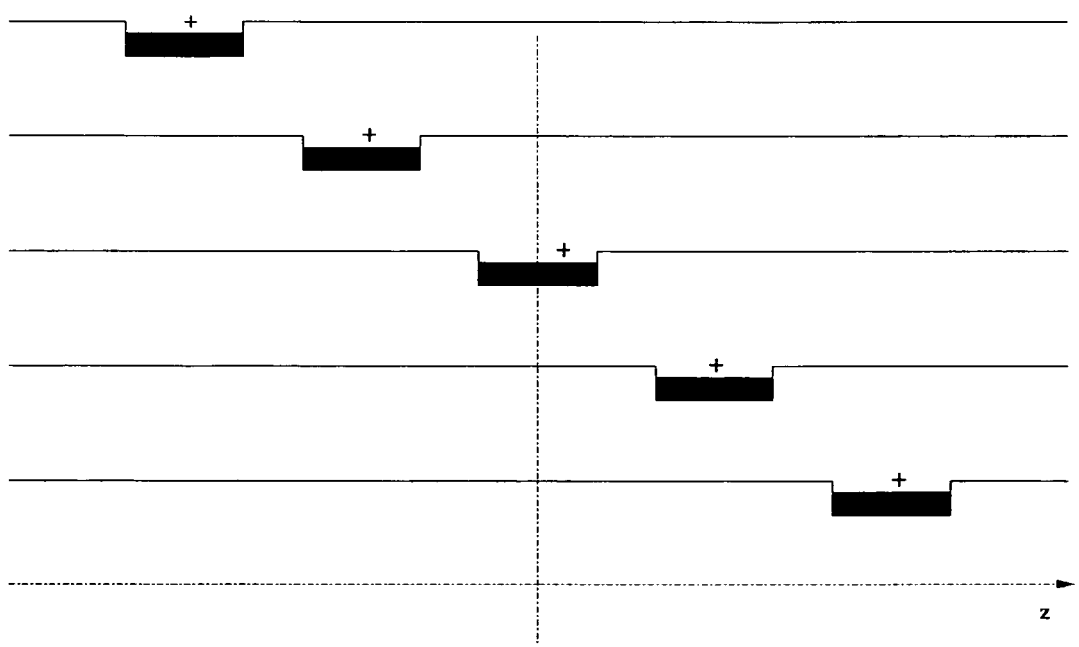
FIG. 6 schematically shows a configuration of coils of a matrix shim system of prior art; each channel, i.e. each combination of coils connected in series and fed by one current source, is shown on a separate row.

FIG. 1 shows an elementary coil and FIG. 6 shows an example of a coil configuration used for the cylindrical symmetric part of a matrix shim system.

Further advantage of the possibility to combine simple coils is taken when the number of coils is in excess of the number of controlled magnetic field components. When determining the currents supplied to the coils, it is possible to observe additional conditions beside the magnetic field component that is required. An optimum for an additional quantity is found by using Lagrange multipliers. An important additional condition is the minimization of the amount of heat produced by the coils. Shim functions using such a configuration of shim coils carrying a current determined by using Lagrangian multipliers to fulfill an additional condition are named Lagrangian shims and are described in [4].

Figure 8:
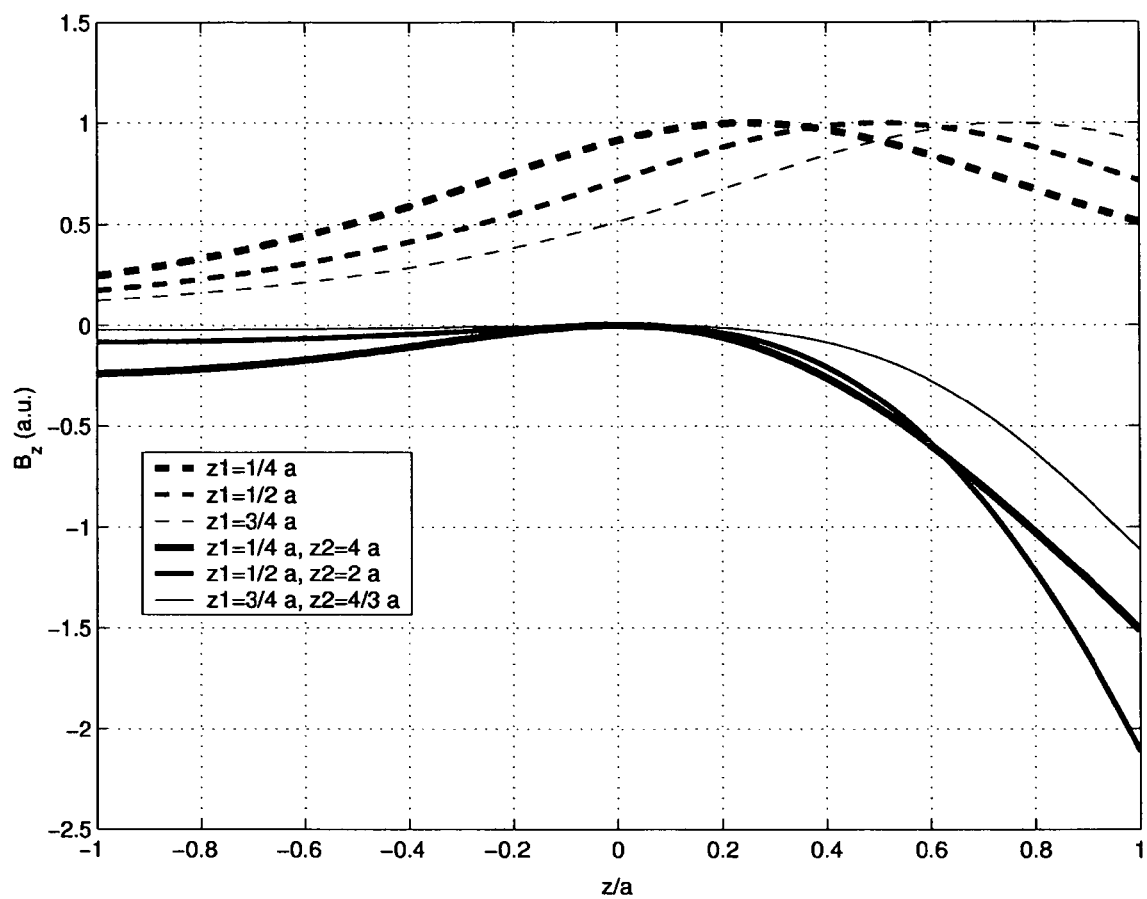
FIG. 8 shows a diagram of the magnetic fields of single coils at z-position $z_1$ (dashed curves) compared to the magnetic fields of the same coils combined with additional coils at z-position $z_2$ that eliminate $A_0$ and $A_1$ components (solid curves)

However, the use of simple coils creates new problems unknown with traditional coil design. Simple coils mainly contribute to the $A_{00}$ term that must stay constant. In FIG. 8 the contribution of single coils to the $A_{00}$ component ($B_z^0$(0)) can be seen (dashed curves). For matrix shim systems, the ratios among the currents in the different coils are selected in a way that no net contribution to $A_{00}$ occurs in summation of all coils. If any of the current sources not exactly supply the current it is supposed to, the deviation from the ideal field is mainly described by $A_{00}$. If such a deviation from the ideal current value is time dependent, it produces, in the case of magnetic resonance techniques, a modulation of the phase of the acquired signal. If the Fourier transformation of the acquired signal is calculated, as is the case in high resolution NMR, and if the deviation is periodic in time, this effect results in sidebands surrounding each spectral line. The amplitudes of these sidebands are proportional to the amplitudes of the central spectral lines. In crowded spectra it is difficult to distinguish between the real spectral lines and the sidebands. Therefore the appearance of sidebands reduces the quality of the spectrum.

Even if the deviation from the ideal current value isn't periodic in time, any current source-will show slight random deviations from the ideal current value. If the coil connected to this current source creates a field with a high $A_{00}$ contribution, there will be random phase modulation of the signal, which increases the noise floor of the spectrum.

If a shim coil group consisting of individual coils connected in series is designed such that the $A_{00}$ contribution is canceled, as taught by the invention, there will be no time dependency of $A_{00}$ even if the current source is imperfect. In the case of the known matrix system, the $A_{00}$ contribution is canceled only if the ideal current value is supplied from all current sources. Deviations from this current of one current source can not be expected to be coherent with deviations from other current sources, so the deviations at least partly add up.

Another difficulty arises from the fact that one can only change the set point value for digitally controlled current sources in finite steps. If a combination of current values is calculated for the desired field, each current value is rounded to a feasible value. The difference between the ideal current values and the feasible current values will result in a deviation of the resulting field from the desired field. This deviation will reflect the form of the fields produced by the coils connected to one current source. In the case of traditional serial shims this will be a little fraction of the desired field, whereas in the case of a matrix shim system consisting of simple coils this deviation will mainly consist of components $A_{00}$ and $A_{10}$. These are the components produced most efficiently by simple coils. It is possible to remove the $A_{00}$ component by using a lock circuit. Unexpected differences in the $A_{10}$ term will remain and make the shimming process more difficult.

Therefore it would be of interest to produce a shim system having the advantages of a matrix system—which are simple coil geometries, possibility to freely combine elementary fields, optimization of additional parameters—and at the same time retaining the advantage of series shims that single current channels do not influence the $A_{00}$ and $A_{10}$ component unless they are built to produce this components.

In the following, a class of coil configurations is proposed which combines the above advantages.

The idea behind the inventive matrix shim system is to replace some of the single annular coils of the conventional matrix shim system by groups of two and more annular coils connected in series, where the z-positions and winding numbers of the annular coils within one group are adjusted such that the low orders of spherical harmonics are suppressed and at the same time several high orders of spherical harmonics are generated with high efficiency, and that this condition is achieved solely by the geometrical configuration of the coils defining the group. The single coils as well as the groups of coils are energized by individually adjustable currents (this is a characteristic property of matrix shim systems) such that their integral effect produces the desired correcting field.

This new matrix shim system, also containing groups of coils instead of only single coils, has the great advantage that the low orders of spherical harmonics, which are normally generated when high orders of spherical harmonics are desired, are compensated by the geometrical configuration of the coils within the group and not by high currents in different single coils which is the case in conventional matrix shim systems. It is important to note that the necessary geometrical stability is much easier to achieve than the necessary current stability.

The basic idea behind the inventive matrix shim system is first described by discussing the properties of the simplest case of such a group of coils, namely a pair of ideally thin coils, and then extended to coils using a finite volume and groups containing more than two coils. As will be shown below, such a pair of coils can be constructed such that the two lowest orders of spherical harmonics, i.e. $A_{00}$ and $A_{10}$, cancel exactly and that there are still enough degrees of freedom to support different higher order spherical harmonics.

A combination of annular coils with the following properties is to be found:
1. a change in the current flowing through the coils does not lead to a change in the z-component of the magnetic field at the center of the volume of interest;
2. a change in the current flowing through the coils does not lead to a change in the first derivative with respect to z of the magnetic field at the center of the volume of interest.

Select a coordinate system where z=0 is the center of the volume of interest. The contribution of an annular coil at z-position $z_k$, with a radius a and carrying a current $I_k$ to the magnetic field component $B_z(0)$ and its first derivative with respect to z are given by $$B_z(0) = \frac{1}{2}\frac{\mu_0}{a}\left(\frac{I_k}{(1+\bar{z}_k^2)^{3/2}}\right)$$

$$\frac{\partial B_z(0)}{\partial z} = -\frac{3}{2}\frac{\mu_0}{a^2}\left(\frac{I_k \bar{z}_k}{(1+\bar{z}_k^2)^{5/2}}\right)$$

where $\bar{z}_k = z_k/a$ and $\mu_0$ is the permeability of free space.

The above requirements can now be expressed as $$B_z(0) = \frac{\partial B_z(0)}{\partial z} = 0 \tag{3}$$

Figure 2:
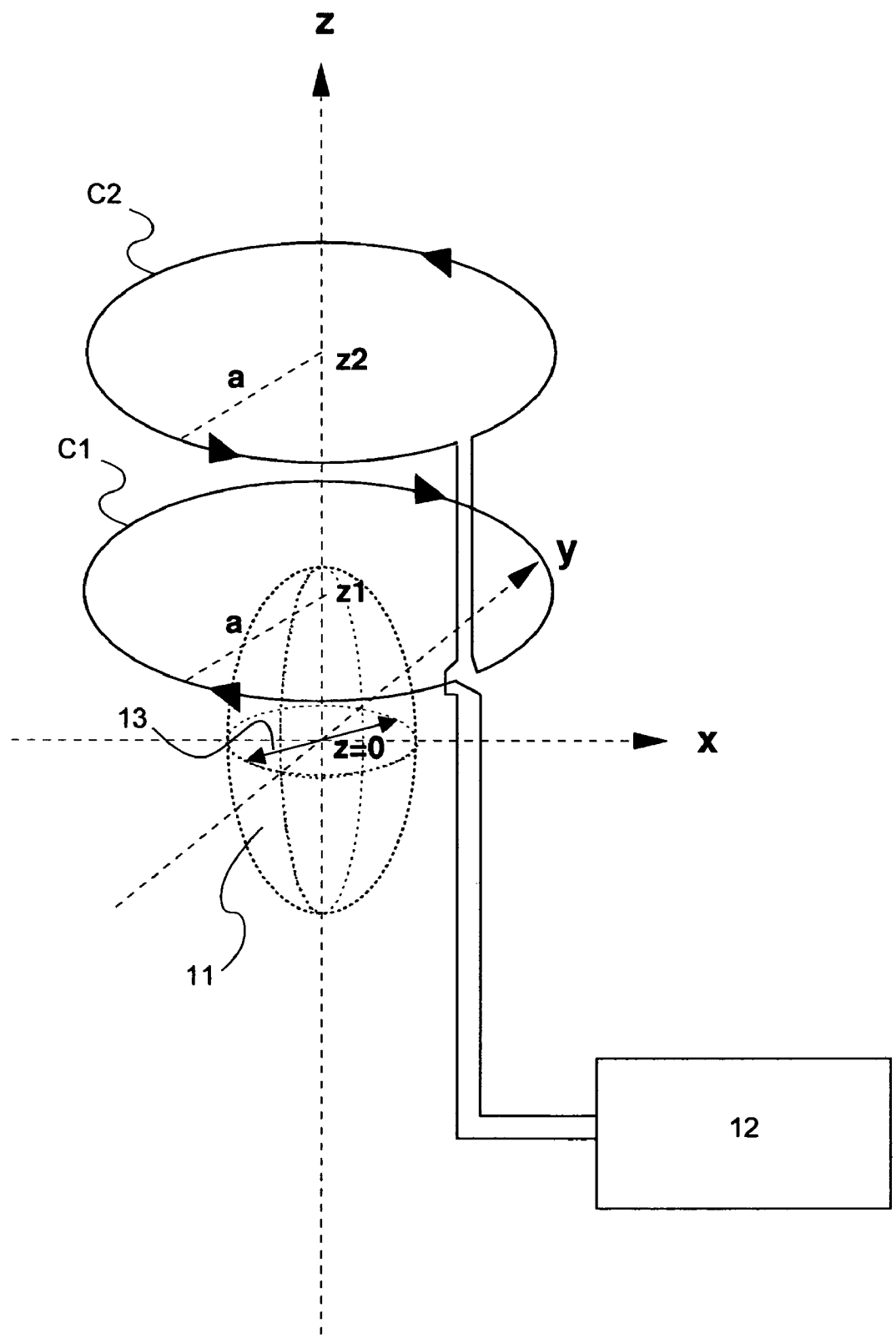
FIG. 2 schematically shows a group of annular coils connected in series and fed by one power supply, in accordance with the invention; the case illustrated here is the case of a group consisting of two coils C1 and C2 positioned at z1 and z2 respectively and having opposite winding directions.

To find a non-trivial solution at least two coils described by their position and current are needed: $(z_1, I_1)$, $(z_2, I_2)$. An example of such a pair of coils is illustrated in FIG. 2. From condition (3) follows a system of two equations $$B_z(0) = \frac{1}{2}\frac{\mu_0}{a}\left(\frac{I_1}{(1+\bar{z}_1^2)^{3/2}} + \frac{I_2}{(1+\bar{z}_2^2)^{3/2}}\right) = 0$$

-continued $$\frac{\partial B_z(0)}{\partial z} = -\frac{3}{2}\frac{\mu_0}{a^2}\left(\frac{I_1 \bar{z}_1}{(1+\bar{z}_1^2)^{5/2}} + \frac{I_2 \bar{z}_2}{(1+\bar{z}_2^2)^{5/2}}\right) = 0$$

Eliminating the currents results in the following condition for the positions $$\frac{\bar{z}_1}{1+\bar{z}_1^2} = \frac{\bar{z}_2}{1+\bar{z}_2^2} \quad (4)$$

If $I_1$ and $\bar{z}_1$ are given, the above condition (4) is a second order equation for $\bar{z}_2$ having the two solutions $$\bar{z}_2 = \begin{cases} 1/\bar{z}_1 \\ \bar{z}_1 \end{cases} \quad (5)$$

Inserting these solutions into equation (3) leads to the current $I_2$ needed in the second coil $$I_2 = \begin{cases} -I_1/|\bar{z}_1|^3 \\ -I_1 \end{cases} \quad (6)$$

The second (trivial) solution describes two counter-wound coils at exactly the same position creating no field at all.

From the first solution one can learn that a pair of coils producing a field according to condition (3) must consist of two coils located on the same side of the center of the volume of interest and have opposite polarity. Additionally, if one of the coils is in the interval $0<|z|<a$, then the other coil is in the interval $a<|z|<\infty$.

Figure 4:
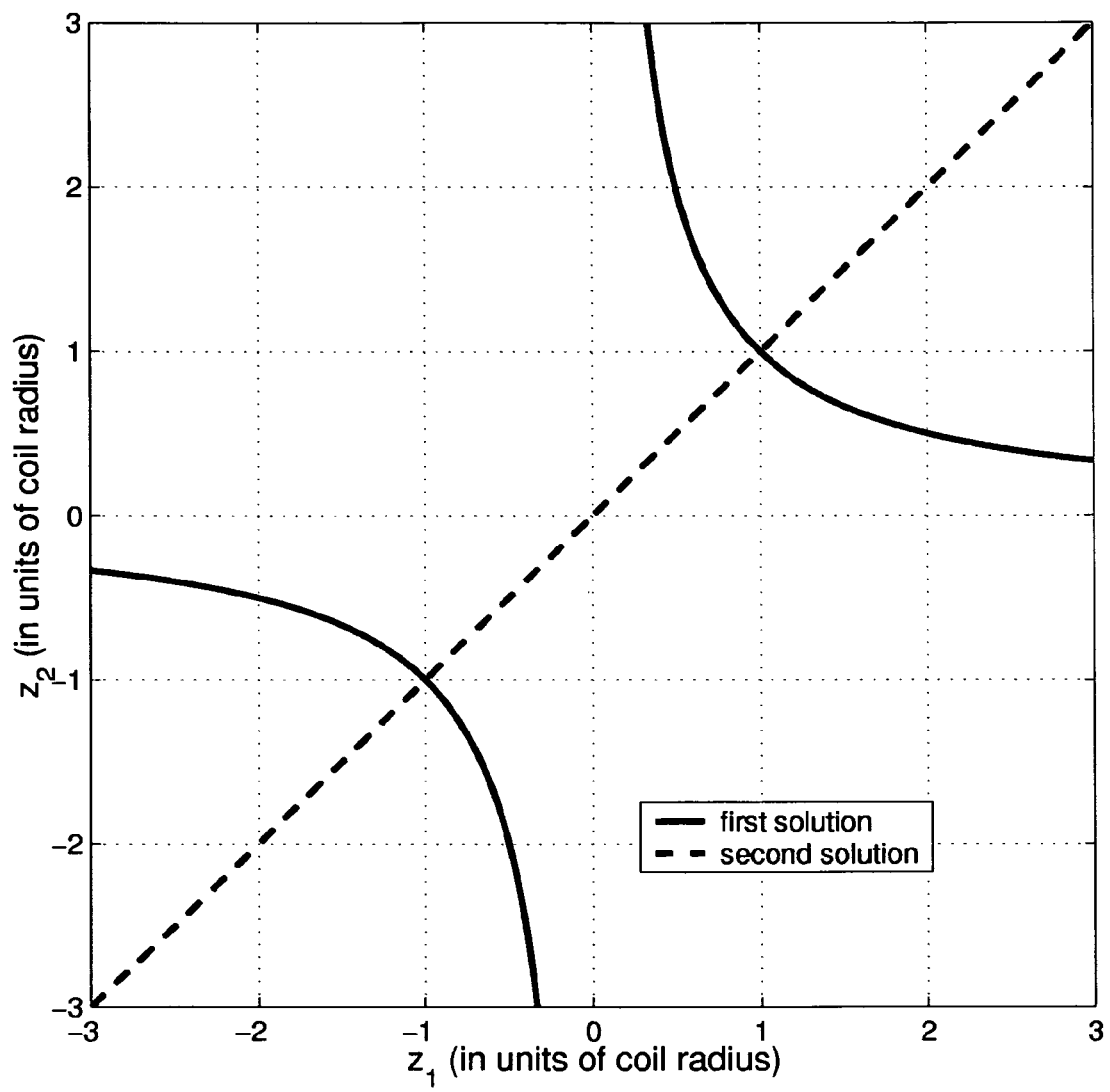
FIG. 4 shows a diagram correlating the z positions of a pair of coils, as calculated as solutions for pairs $(z_1,z_2)$ of z-positions according equations (5,6)

The possible combinations for pairs $(z_1, z_2)$ of z-positions according equations (5,6) are shown in FIG. 4.

At first sight one may judge the second solution to be useless. But if a slight deviation from the exact solution is acceptable, two counter-wound coils at two different but close z-positions produce only little $A_{00}$ and $A_{10}$ components, as long as the difference in z-positions is small compared to the coil radius a (see FIG. 3 for the contribution to the $A_{00}$ and $A_{10}$). Once the two positions are selected, there is the possibility to adjust the ratio $I_1:I_2$ such that either $A_{00}$ or $A_{10}$ is canceled exactly.

Splitting one of the coils into two parts and positioning these parts on both sides of the other coil can achieve an even better solution. If the z-positions are relatively close compared to the coil radius a, and the center of gravity of the counter-wound coil pair is at the same position as the coil wound according the first direction, $A_{00}$ and $A_{10}$ are mostly canceled. The two additional degrees of freedom of the third coil, current $I_3$ and position $z_3$ can be adjusted such that $A_{00}$ and $A_{10}$ are exactly canceled.

Thus, the following simple solutions to construct coils that produce no or little $A_{00}$ and $A_{10}$ components exist:
1. Counter-wound pair of coils connected in series at positions $\bar{z}_1, 1/\bar{z}_1$
2. Counter-wound pair of coils connected in series at closely spaced z-positions
3. Three coils connected in series, where the two outer coils have opposite winding direction compared to the inner coil.

In principle it is possible to combine four, five or more coils connected in series that fulfill the condition (3). Each additional coil adds two degrees of freedom, namely a z-position and a current. If in contrast to classical design of shim coils no restrictions are imposed on the contributions to $A_{k0}$ for $A_{k0} \geq 2$, a great variety of possible configurations exist. But with every additional coil simplicity is lost. The possibility to select the most efficient current distribution for a certain shimming problem, which is highest for a matrix shim system containing simple coils and a plurality of current sources, is reduced with pre-combined coils. Complicated combinations of coils reintroduce the problem avoided with matrix shim systems. Simple configurations are therefore preferred.

In the preceding section the conditions necessary for the elimination of $A_{00}$ and $A_{10}$ components were determined. The question arises, what is necessary to achieve at least a reduction in $A_{00}$ and $A_{10}$.

Starting from a coil with given z-position and winding direction, z-position and winding direction for a second coil are to be found such that both coils connected in series produce less $A_{00}$ and $A_{10}$ than the first coil alone. From FIG. 3 can be seen, that the sign of contribution to $A_{00}$ depends only on the winding direction and not on the z-position. To reduce $A_{00}$ the second coil needs to have opposite winding direction compared to the first coil. The contribution to $A_{10}$ changes sign at $z=0$ (FIG. 3). If the second coil has opposite winding direction compared to the first coil, it produces an $A_{10}$ component of the opposite sign as the first coil if it is on the same side of $z=0$ as the first coil.

Thus, the second coil needs to be located on the same side of the center of the volume of interest and have opposite polarity.

A special situation occurs, if the first coil is positioned at $z=0$. The $A_{10}$ component is already zero. To reduce the $A_{00}$ contribution without creating an $A_{10}$ component, two symmetrically positioned, coils with opposite winding direction compared to the first coil are necessary.

Starting from the ideal first solution of (5,6) a coil may be constructed by placing blocks of windings centered around $z_1$ and $z_2$ determined as described above and using winding numbers $N_1$, $N_2$ wound in opposite direction and connected in series. The ratio $N_1:N_2$ should be a good approximation to $|I_1|:|I_2|=1/|\bar{z}|^3$.

To achieve an approximation to the second solution of (5,6) blocks of windings centered around $z_1$ and $z_2$ (and $z_3$ if three coils are used) with opposite winding direction and winding numbers $N_1=N_2$ (winding direction '−+−' or '+−+' and winding numbers $N_2=N_1+N_3$ for three coils) are placed at the desired position and connected in series.

The electrical power needed to produce a given field distribution is inversely proportional to the total cross section of the coil. Therefore the cross section of the coils should be increased as much as is compatible with other restrictions. Taking the limitations in voltage and current of the current supplies into account, available space in radial and axial direction can be filled up using an appropriate wire gauge.

Having now a feasible solution the fields produced by this coil configuration might show slight deviations from the original conditions. Slight adjustments on the winding numbers or positions can be applied and their effect on the field calculated by using Biot-Savart's law. Readjustments are repeated until the conditions are fulfilled to the desired degree.

Up to now the influence on the magnetic field at the center of the volume of interest has been discussed. If the volume of interest is extended in the z-direction the first conditions may rather be imposed on the average value of the field instead of the value at the center. The second condition may be imposed to the difference of the field at opposite ends of the volume of interest rather then on the first derivative with respect to z. Changing conditions in this way may require another slight correction to the ideal solution.

Figure 7:
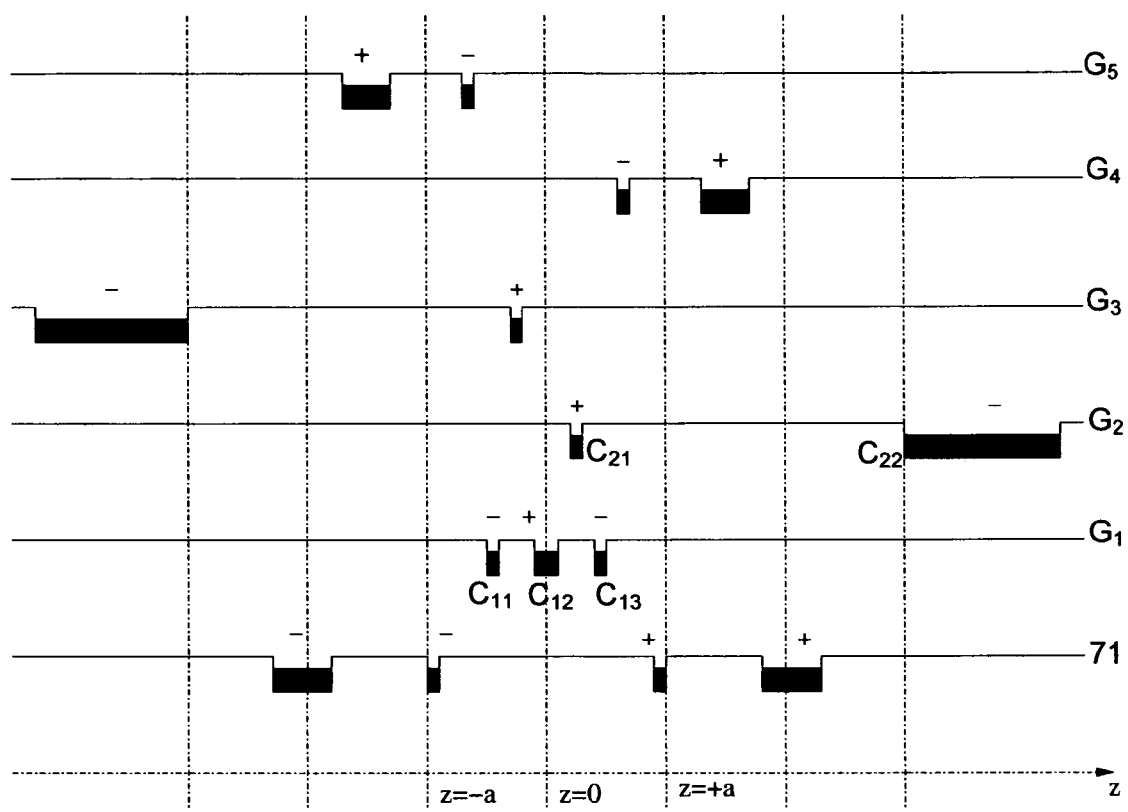
FIG. 7 schematically shows a configuration of coils of an inventive matrix shim system comprising five groups G1, ..., G5 and a gradient coil combination; each channel, i.e. each combination of coils connected in series and fed by one current source, is shown on a separate row.

FIG. 7 schematically shows a configuration of coils of an inventive matrix shim system. Each channel, i.e. each combination of coils connected in series and fed by one current source, is shown on a separate row. The inventive matrix shim system contains one combination 71 of annular coils to generate a $1^{st}$ order gradient (see lowest row). All other annular coils in the matrix shim system belong to one of the groups $G_1, \ldots, G_5$. The matrix shim system of FIG. 7 is capable of correcting harmonic functions up to the order N=6, corresponding to the total number of current supplies connected to annular coils of the matrix shim system. Further, z positions of the coils are selected such that it is possible to place all annular coils on the same cylinder of radius a.

Figure 9A:
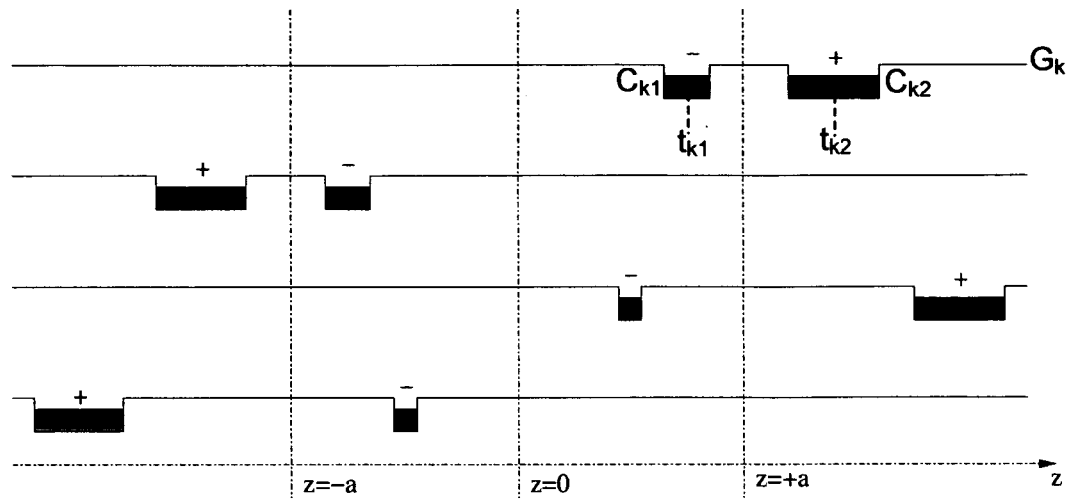
FIG. 9a schematically shows four examples for groups $G_k$ of two coils $C_{k1}$, $C_{k2}$ at z positions $t_{k1}$ and $t_{k2}=a^2/t_{k1}$, suppressing $A_{00}$ and $A_{10}$ coefficients of the group $G_k$.
Figure 9B:
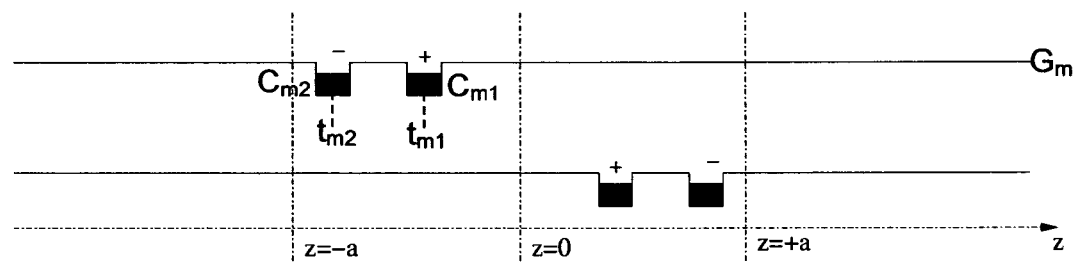
FIG. 9b schematically shows two examples of groups $G_m$ of two coils $C_{m1}$, $C_{m2}$ at z positions $t_{m1}$, $t_{m2}$ with $|t_{m1}-t_{m2}|/a \leq 0.5$, suppressing $A_{00}$ and $A_{10}$ coefficients of the group $G_m$.
Figure 9C:
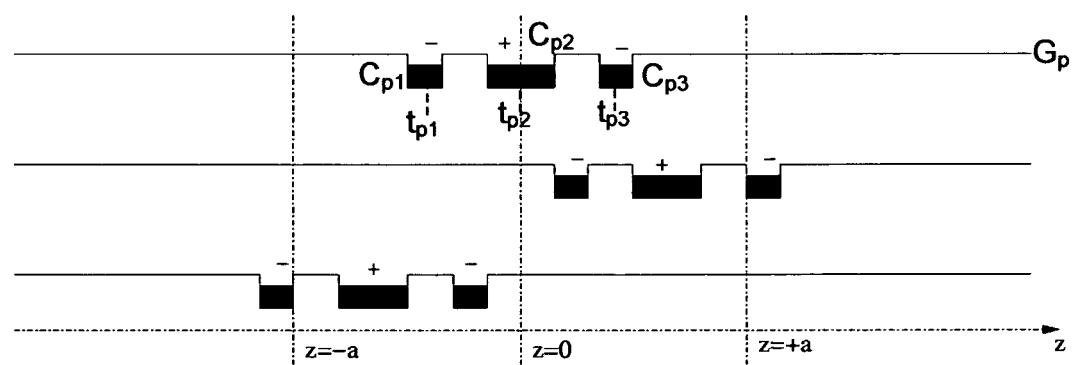
FIG. 9c schematically shows three examples of groups $G_p$ of three coils $C_{p1}$, $C_{p2}$, $C_{p3}$ at z positions $t_{p1}$, $t_{p2}$, $t_{p3}$ with winding numbers $N_{p1}$, $N_{p2}$, $N_{p3}$, with $|t_{m1}-t_{m2}|/a \leq 0.5$ and $|t_{m3}-t_{m2}|/a \leq 0.5$ and $N_{p1}+N_{p3}=N_{p2}$, suppressing $A_{00}$ and $A_{10}$ coefficients of the group $G_p$.

FIGS. 9a through 9c schematically shows possible configurations for groups of coils constructed such that they suppress $A_{00}$ and $A_{10}$ coefficients of the respective group. A typical matrix shim system in accordance with the invention comprises several of such groups. Each example of a group with its coils is shown in a different row. For simplification, reference signs are only placed at the example shown in the uppermost respective row. The radius a is the radius of each group of coils and is shown as a unit of measurement on the z-axis.

In more detail, FIG. 9a shows four examples of groups $G_k$ of two annular coils $C_{k1}$ and $C_{k2}$ both having a radius a. Both coils $C_{k1}$, $C_{k2}$ are located on the same side of the origin of the z-axis with respect to the z direction. Coil $C_{k1}$ is located at z position $t_{k1}$, and coil $C_{k2}$ is located at a z position of $t_{k2}=a^2/t_{k1}$.

FIG. 9b shows two examples of groups $G_m$ of two annular coils $C_{m1}$ and $C_{m2}$, both having a radius a and a winding number $N_m$. The coil $C_{m1}$ is wound in the other direction as coil $C_{m2}$. The coils $C_{m1}$, $C_{m2}$ are located at z positions $t_{m1}$ and $t_{m2}$, with $|t_{m1}-t_{m2}|/a \leq 0.5$.

FIG. 9c shows three examples of groups $G_p$ of three annular coils $C_{p1}$, $C_{p2}$, $C_{p3}$. All coils $C_{p1}$, $C_{p2}$, $C_{p3}$ have the same radius a, have winding numbers $N_{p1}$, $N_{p2}$, $N_{p3}$, and have z positions $t_{p1}$, $t_{p2}$, $t_{p3}$, with $t_{p1}<t_{p2}<t_{p3}$. The coils $C_{p1}$ and $C_{p3}$ are wound in the other direction as coil $C_{p2}$, with $N_{p1}+N_{p3}=N_{p2}$, and further with $|t_{m1}-t_{m2}|/a \leq 0.5$ and $|t_{m3}-t_{m2}|/a \leq 0.5$.

FIG. 8 illustrates the reduction of the $A_{00}$ and $A_{10}$ components near z=0 if a given coil at position $z_1$ is combined with an additional coil at position $z_2$ and with a current as determined by equations (5,6).

In the following we name coils that eliminate the $A_{00}$ and $A_{10}$ component as is described above $A_{00}A_{10}$-free coils. To produce all necessary shim functions it is not enough to use only $A_{00}A_{10}$-free coils. In most cases a coil is needed that enables to remove an $A_{10}$ component. For this purpose a conventionally designed coil producing $A_{10}$ can be added to a set of $A_{00}A_{10}$-free coils. Low orders of $A_{n0}$, such as $A_{20}$, $A_{30}$, may be more efficiently generated by conventional designs. In these cases an ideal combination of coils contains coils in a conventional design to produce the low order components and a set of $A_{00}A_{10}$-free coils, all of which are freely combinable to produce the higher order components.

Additional coils can be added to produce fields that are not invariant under rotation to produce tesseral harmonic functions.

It is possible to use more coils that are individually connected to a power supply than the number of magnetic field components to be controlled. The extra degrees of freedom can be used to optimize an additional parameter. Examples are minimization of heat produced by the coils, minimization of indirect field changes in the volume of interest or minimization of field change at a given point outside the shim system.

$A_{00}A_{10}$-free coil pairs according the first solution of (5,6) have an additional interesting property: Keeping the number of turns of the inner coil fixed, the number of turns of the outer coil increases rapidly ($I_2 \propto \bar{z}_2^3$) with increasing $\bar{z}_2$. The second coil therefore creates a relatively strong field outside the shim system while having relatively small effects in the volume of interest. Generally, changing currents in the shim coils can have indirect influences on the magnetic field in the volume of interest, e.g. by causing eddy-currents in the surrounding conducting materials, by changing the magnetization of ferromagnetic or superconducting materials or by coupling to a closed superconducting loop. With appropriate selection of the coil positions, $A_{00}A_{10}$-free coil pairs can be used to at least partially compensate for such effects without compromising the quality of the fields used for shimming. I.e. if a change in shim currents has an unwanted effect on the surrounding of the shim system, $A_{00}A_{10}$-free coil pairs can act as shielding coils.

When using $A_{00}A_{10}$-free coil pairs according the first solution of (5,6) positioning of the inner coil close to z=0 can be strongly restricted by the maximum value for the z-position of the corresponding outer coil or by the maximum number of windings of the outer coil. With a z-position of the inner coil exactly at z=0, the z-position and number of windings for the exact solution both become infinite! But coils at z-positions close to z=0 contribute particularly strong to high order spherical harmonics. $A_{00}A_{10}$-free coil triples that approximate the second solution of (5,6) can be placed at these positions without restrictions.

As can be seen in FIG. 3, the contribution to high order spherical harmonics, such as $A_{50}$, $A_{60}$, shows its maxima and a characteristic alternation of sign in the region near z=0. One finds the same pattern for $A_{70}$, $A_{80}$, etc. with increasingly smaller distances between the extremal values. The positions of the elementary coils of a three coil system, as described above, are preferably selected such that they match three neighboring extremal values of high order spherical harmonics.

The above discussion leads to asymmetric configurations for elementary coil combinations. By including for each such coil combination a mirror symmetric counter part, symmetry in the set of the fields that can be produced by the shim system can be reached. E.g. even functions in z can be produced by feeding the same current to both of such a mirror symmetric pair of coil combinations.

It is not necessary to have this symmetry in all cases. In cases where the object under investigation produces a previously known asymmetric field distortion in the volume of interest or where space available for shim coils is asymmetrically distributed around the volume of interest, it can be particularly useful to have one of these asymmetric coil configuration without the corresponding mirror symmetric counterpart and still producing no $A_{00}$ and $A_{10}$ components.

Up to this point the properties of individual components of a shim system have been discussed. The ultimate goal of coil design is to find a whole set of such individual coils or groups of coils that can all be placed in the available volume and as a whole set of coils are able to produce desired shim functions efficiently. Describing a whole shim system requires a large number of continuous parameters (z-positions, radii, wire diameters) as well as discrete parameters (number of windings, group of coils connected in series to which a certain coil belongs). There are several known methods that apply numerical optimization to this kind of design problem.

The following steps are needed in order to find an ideal coil configuration:

Defining parameters describing the coil geometries

Defining ranges of feasible values for said parameters

Defining a cost function F to be minimized where this cost function can be calculated for any combination of values for said parameters and is constructed such that lower values resulting from the function evaluation reflect an improvement in the coil design. Minimization is not a restriction: if a certain property of the system should be maximized it can be incorporated into F as negative summand.

Applying a numerical optimization algorithm in order to find a set of parameters that define a minimum of F. Among known algorithms that provide the desired functionality are e.g. gradient descent method, conjugated gradient method, simulated annealing, evolutionary optimization and genetic optimization. The latter three methods are particularly suited to handle discrete parameters.

The total number of parameters involved in the optimization defines the complexity of the problem and therefore the amount of time and computer power that has to be spent in order to find a usable result.

Using coil configuration as described in the preceding chapter can have an influence on the first three of the above steps. Parameterization can be done by explicitly using equations such as (5,6) to reduce the number of free parameters and select other parameters depending on the values of the free parameters. Optimization has to be performed only over free parameters. The criteria used to derive the equations are automatically fulfilled exactly. If an exact solution is not necessary, a significant reduction of $A_{00}$ and $A_{10}$ terms can be achieved by setting the ranges of feasible values as specified above. The most elegant way is to include the conditions imposed to the elementary coils directly into the cost function F.

In summary, a matrix shim system for generating magnetic field components superimposed on a main static magnetic field, comprising a plurality of annular coils, is characterized in that it comprises g groups $G_1 \ldots G_g$ of coils, with g being a natural number $\geq 1$, wherein each group $G_i$ consists of at least two single annular coils connected in series, wherein each group $G_i$ is designed to generate, in use, a magnetic field $$B_z(G_i) = \sum_{n=0}^{\infty} A_{n0}(G_i) \cdot T_{n0},$$

that for each group $G_i$, there are at least two values of n for which $$\frac{|A_{n0}(G_i) \cdot R^n|}{\max\{|A_{20}(G_i) \cdot R^2|, \ldots, |A_{N0}(G_i) \cdot R^N|\}} \geq 0.5 \text{ and } N \geq n \geq 2,$$

with N: the total number of current supplies of the matrix shim system, and R: smallest inside radius of any of the annular coils of the matrix shim system, and that for each group $G_i$ of coils, an individual, adjustable electrical current supply (12) is provided. The inventive matrix shim system is both simple in design and stable against current fluctuations.

List of Reference Signs 11 volume of interest 12 current supply 13 diameter of the volume of interest perpendicular to the z direction 71 first order gradient coil combination $G_1, G_2, G_3, \ldots$ groups with index numbers 1, 2, 3, ... of coils $C_{11}, C_{12}, C_{13}, \ldots$ coils with index numbers 1, 2, 3, ... of group with index number 1

REFERENCES

[1] Anderson W A. Electrical current shims for correcting magnetic Fields. Rev. Sci. Instrum. 32 (1961), March, Nr. 3, 241-250

[2] Anet F A L, Kopelevich M. Ultrahigh Resolution in Proton NMR Spectra at 500 MHz: Two-Bond Intrinsic Chlorine and Silicon Isotope Effects. J. Am. Chem. Soc. 109 (1987), 5870-5871

[3] Gang R E. Apparatus for Improving the Uniformity of Magnetic Fields. U.S. Pat No. 3,287,630 (1966).

[4] Ishikawa H. Apparatus for Generating Corrective Magnetic Field. U.S. Pat No. 5,661,401 (1997).

[5] Konzbul P, Švéda K, Srnka A. Design of Matrix Shim Coils System for Nuclear Magnetic Resonance. IEEE Transactions on Magnetics 36 (2000), Nr. 4, 1732-1736.

We claim:

1. A matrix shim system having a plurality of annular coils whose axes coincide with a z-axis, the shim system generating magnetic field components superimposed on a main static magnetic field parallel to the z-axis, the magnetic field components-acting to homogenize a magnetic field component of the main static magnetic field along the z-axis in a volume of interest centered at an origin of the z-axis, the system comprising:

g groups $G_1 \ldots G_g$ of coils, with g being a natural number $\geq 1$, wherein each group $G_i$ consists of at least two single annular coils $C_{i1} \ldots C_{ic(i)}$ connected in series, with i: index number of the group, and c(i) being the amount of annular coils within group i, each group $G_i$ being designed to generate, in use, a magnetic field $$B_z(G_i) = \sum_{n=0}^{\infty} A_{n0}(G_i) \cdot T_{n0} = \sum_{n=0}^{\infty} [A_{n0}(G_i) \cdot R^n] \cdot [T_{n0}/R^n],$$

with $A_{n0}$: series coefficients of order n and degree 0, $T_{n0}$: spherical harmonic function of order n and degree 0; and n: index of summation, wherein a highest value $B_{max}$ of harmonic field components of an order between 2 and N of group $G_i$ is given by $$B_{max}(G_i) = \max\{|A_{20}(G_i) \cdot R^2|, \ldots, |A_{N0}(G_i) \cdot R^N|\},$$

and for each group $G_i$, there are at least two values of n for which $$\frac{|A_{n0}(G_i) \cdot R^n|}{B_{\max}(G_i)} \geq 0.5 \text{ and } N \geq n \geq 2,$$

with N: a total number of current supplies connected to annular coils of the matrix shim system, and R: a smallest inside radius of any of the annular coils of the matrix shim system; and an individual, adjustable electrical current supply for each group $G_i$ of coils.

2. The matrix shim system of claim 1, wherein in each group $G_i$, for the two values of n $$\frac{|A_{n0}(G_i) \cdot R^n|}{|A_{00}(G_i)|} \geq 100 \text{ and } \frac{|A_{n0}(G_i) \cdot R^{(n-1)}|}{|A_{10}(G_i)|} \geq 10.$$

3. The matrix shim system of claim 1, wherein $g \geq 4$ or $g \geq 10$.

4. The matrix shim system of claim 1, wherein each annular coil $C_{is}$ belonging to a group $G_i$ is designed to generate, in use, a magnetic field $$B_z(C_{is}) = \sum_{n=0}^{\infty} A_{n0}(C_{is}) \cdot T_{n0},$$

and that for all groups $G_i$, $$\frac{\left|\sum_{s=1}^{c(i)} A_{00}(C_{is})\right|}{\max\{|A_{00}(C_{i1})|, \ldots, |A_{00}(C_{ic(i)})|\}} \leq 0.5,$$

with s: coil index within a group of coils.

5. The matrix shim system of claim 1, wherein each annular coil $C_{is}$ belonging to a group $G_i$ is designed to generate, in use, a magnetic field $$B_z(C_{is}) = \sum_{n=0}^{\infty} A_{n0}(C_{is}) \cdot T_{n0},$$

and that, for all groups $G_i$, $$\frac{\left|\sum_{s=1}^{c(i)} A_{10}(C_{is})\right|}{\max\{|A_{10}(C_{i1})|, \ldots, |A_{10}(C_{ic(i)})|\}} \leq 0.5,$$

with s: coil index within a group of coils.

6. The matrix shim system of claim 1, wherein there is at least one group $G_j$ with a first partial coil $C_{j1}$ of $G_j$ that is located such that a distance from a center of this first coil to the center of the volume of interest is less than half a radius a of the coil $C_{j1}$, and remaining coils of $G_j$ are positioned such that their magnetic fields, together with magnetic fields of the first coil $C_{j1}$, generate no field gradients of order q and lower at the center of the volume of interest, with q: a natural number.

7. The matrix shim system of claim 1, wherein there is at least one group $G_k$ of the groups $G_1 \ldots G_g$ consisting of two annular coils $C_{k1}$, $C_{k2}$ both having a radius of $a_k$, both coils $C_{k1}$, $C_{k1}$ being located on a same side of the origin of the z-axis with respect to the z direction, a coil $C_{k1}$ being located at a z-position $t_{k1}$, and a coil $C_{k2}$ being located at a z-position $t_{k2} = a_k^2/t_{k1}$.

8. The matrix shim system of claim 7, wherein the coil $C_{k1}$ has a winding number of $N_{k1}$ and the coil $C_{k2}$ has a winding number $N_{k2} = -N_{k1} \cdot a^3/t_{k1}^3$, wherein the minus sign indicates that coil $C_{k1}$ is wound in an opposite direction as coil $C_{k2}$.

9. The matrix shim system of claim 7, wherein z-positions and ratios of winding numbers of coils of the group $G_k$ are adjusted such that changing currents in these coils has a strong indirect influence on the magnetic field in the volume of interest.

10. The matrix shim system of claim 9, wherein the matrix shim system causes eddy currents, changes a magnetization of ferromagnetic or superconducting materials, and/or couples to a closed superconducting loop.

11. The matrix shim system of claim 9, further comprising an algorithm to determine currents such that indirect influences on the magnetic field in the volume of interest are minimized by using groups of coils to compensate for indirect influences of other coils.

12. The matrix shim system of claim 1, wherein there is at least one group $G_m$ of the groups $G_1 \ldots G_g$ consisting of two annular coils $C_{m1}$, $C_{m2}$ both having a radius of $a_m$ and a winding number of $N_m$, coil $C_{m1}$ being wound in an other direction as coil $C_{m2}$, wherein coil $C_{m1}$ is located at a z-position $t_{m1}$, and coil $C_{m2}$ is located at a z-position $t_{m2}$, with $$\frac{|t_{m1} - t_{m2}|}{a_m} \leq 0.5.$$

13. The matrix shim system of claim 1, wherein there is at least one group $G_p$ consisting of three annular coils $C_{p1}$, $C_{p2}$, $C_{p3}$ all having a radius of $a_p$, and having winding numbers $N_{p1}$, $N_{p2}$, $N_{p3}$, and located at z-positions $t_{p1}$, $t_{p2}$, $t_{p3}$, with $t_{p1} < t_{p2} < t_{p3}$, wherein coils $C_{p1}$ and $C_{p3}$ are wound in an opposite direction as coil $C_{p2}$, and $N_{p1} + N_{p3} = N_{p2}$, wherein $$\frac{|t_{p1} - t_{p2}|}{a_p} \leq 0.5 \text{ and } \frac{|t_{p3} - t_{p2}|}{a_p} \leq 0.5.$$

14. The matrix shim system of claim 1, wherein in each group $G_i$, for the two values of n $$\frac{|A_{n0}(G_i) \cdot R^{(n-2)}|}{|A_{20}(G_i)|} \geq 10.$$

15. The matrix shim system of claim 1, further comprising additional coils, which produce magnetic fields that are not axially symmetric with respect to the z-axis.

16. The matrix shim system of claim 1, further comprising a means for performing an algorithm to determine necessary currents to be supplied to the coils of the matrix shim system in order to homogenize the magnetic field component along the z-axis in the volume of interest (11).

17. The matrix shim system of claim 16, wherein said algorithm determines the currents such that an amount of heat produced by the coils is minimized.

18. The matrix shim system of claim 1, wherein apart from annular coils intended for generating a $1^{st}$ order field gradient, all annular coils of the matrix shim system belong to one of the groups $G_1 \ldots G_g$.

19. The method for designing a matrix shim system of claim 1, the method comprising the steps of:
  a) defining parameters describing coil geometries;
  b) defining ranges of feasible values for said parameters;
  c) defining a cost function F to be minimized, wherein this cost function can be calculated for any combination of values for said parameters and is constructed such that lower values resulting from the function evaluation reflect an improvement in the coil design, the cost function F containing terms of the form $$F = w_0 \cdot \sum_{i=1}^{g} |A_{00}(G_i)|^{p_0} + w_1 \cdot \sum_{i=1}^{g} |A_{10}(G_i)|^{p_1} - w_2 \cdot \sum_{i=1}^{g} |A_{20}(G_i)|^{p_2} \ldots -$$

-continued $$w_N \cdot \sum_{i=1}^{g} |A_{N0}(G_i)|^{p_N} + F_{not\_G}$$

where $w_0, w_1, \ldots, w_N$ defines a relative importance of suppression or production of a spherical harmonic, $p_0, p_1, \ldots, p_N$ define a relative importance of small versus big terms, $F_{not\_G}$ is a cost function for all coils that are not built as groups of coils according claim 1; and
  d) applying an numerical optimization algorithm in order to find a set of parameters that define a minimum of F.

20. The method of claim 19, wherein parameters describing the coils are selected to automatically satisfy conditions which reduced a total number of parameters.

21. The method of claim 19, wherein the numerical optimization algorithm involves at least one of a gradient descent method, a conjugated gradient method, simulated annealing, evolutionary optimization, and genetic optimization.

22. A computer program implementing the steps of the method of claim 19.

* * * * *